(12) United States Patent
Alonso et al.

(10) Patent No.: US 9,515,517 B2
(45) Date of Patent: *Dec. 6, 2016

(54) SYSTEM FOR THE ELECTRONIC MANAGEMENT OF PHOTOVOLTAIC CELLS WITH ADAPTED THRESHOLDS

(75) Inventors: Corinne Alonso, Ramonville Saint Agne (FR); Alona Berasategi, Idiazabal (ES); Cédric Cabal, Toulouse (FR); Bruno Estibals, Saint Thomas (FR); Stéphane Petibon, Deols (FR); Marc Vermeersch, Le Vésinet (FR)

(73) Assignees: Total Marketing Services, Puteaux (FR); Centre National De La Recherche Scientifique, Paris (FR)

( * ) Notice: Subject to any disclaimer, the term of this patent is extended or adjusted under 35 U.S.C. 154(b) by 738 days.

This patent is subject to a terminal disclaimer.

(21) Appl. No.: 13/515,082

(22) PCT Filed: Dec. 10, 2010

(86) PCT No.: PCT/IB2010/055756
§ 371 (c)(1),
(2), (4) Date: Jun. 11, 2012

(87) PCT Pub. No.: WO2011/070547
PCT Pub. Date: Jun. 16, 2011

(65) Prior Publication Data
US 2012/0256612 A1 Oct. 11, 2012

(30) Foreign Application Priority Data

Dec. 11, 2009 (FR) ..................... 09 58899

(51) Int. Cl.
*H02M 3/158* (2006.01)
*H02J 7/35* (2006.01)
(Continued)

(52) U.S. Cl.
CPC ........... *H02J 7/35* (2013.01); *H01L 31/02021* (2013.01); *H02M 3/1584* (2013.01);
(Continued)

(58) Field of Classification Search
CPC .................. H02M 3/1584; H02M 2001/0032; H02M 2001/0054; H02M 2001/0067
USPC .............. 323/272, 299, 300; 363/65; 307/82
See application file for complete search history.

(56) References Cited

U.S. PATENT DOCUMENTS 4,636,931 A 1/1987 Takahashi et al.
6,169,678 B1 * 1/2001 Kondo ............. H01L 31/02021
323/906
(Continued)

FOREIGN PATENT DOCUMENTS

CN 100553398 6/2006
CN 101170205 4/2008
(Continued)

OTHER PUBLICATIONS

Kjaer; "A Review of Single-Phase Grid-Connected Inverters for Photovoltaic Modules;" IEEE Transactions on Industry Applications; vol. 41; No. 5; Sep./Oct. 2005; pp. 1292-1306.
(Continued)

*Primary Examiner* — Jue Zhang
*Assistant Examiner* — Lakaisha Jackson
(74) *Attorney, Agent, or Firm* — Daly, Crowley, Mofford & Durkee, LLP

(57) ABSTRACT

The invention relates to a system for the electronic management of a photovoltaic generator, said system comprising a plurality of n static converters (11, 12, 13) connected in parallel, each converter (11, 12, 13) being electrically connected to at least one photovoltaic cell (10) of the generator. The number of converters connected is determined by comparing the generated power to thresholds P1, P2, . . . , Pn-1 which are defined as the power values substantially at the point of intersection of the performance curves for an increasing number of converters. The invention also relates to a generator comprising said system and to the associated control method.

21 Claims, 3 Drawing Sheets

(51) Int. Cl.
*H01L 31/02* (2006.01)
*H02M 1/00* (2006.01)

(52) U.S. Cl.
CPC .............. *H02M2001/0032* (2013.01); *H02M 2001/0054* (2013.01); *Y02B 70/1491* (2013.01); *Y02B 70/16* (2013.01); *Y02E 10/566* (2013.01)

(56) References Cited

U.S. PATENT DOCUMENTS

| | | | |
|---|---|---|---|
| 6,259,017 B1 | 7/2001 | Takehara et al. | |
| 6,285,572 B1* | 9/2001 | Onizuka | G05F 1/67 363/72 |
| 9,310,820 B2 | 4/2016 | Alonso et al. | |
| 2005/0116671 A1* | 6/2005 | Minami | G05F 1/67 318/275 |
| 2007/0248877 A1* | 10/2007 | Qahoug | H02J 1/10 429/121 |
| 2009/0027001 A1* | 1/2009 | Haines | H02J 7/35 320/101 |
| 2009/0224731 A1* | 9/2009 | Tang | H02M 3/1584 323/241 |
| 2009/0283129 A1 | 11/2009 | Foss | |
| 2011/0232714 A1* | 9/2011 | Bhavaraju | H02J 3/385 136/244 |
| 2012/0106204 A1* | 5/2012 | Imanishi | H02M 3/1584 363/16 |
| 2012/0217948 A1* | 8/2012 | Bouchez | H02J 1/102 323/304 |

FOREIGN PATENT DOCUMENTS

| | | |
|---|---|---|
| CN | 1011709205 | 4/2008 |
| CN | 101405088 | 4/2009 |
| EP | 1 047 179 B1 | 10/2000 |
| JP | S59-017317 | 1/1984 |
| JP | H07325635 A | 12/1995 |
| JP | H1023683 A | 1/1998 |
| JP | HEIL10-69321 | 3/1998 |
| JP | H11282554 A | 10/1999 |
| JP | H11341816 A | 12/1999 |
| JP | 2001016859 A | 1/2001 |
| JP | 2006-006019 A | 1/2006 |

OTHER PUBLICATIONS

International Search Report of the ISA for PCT/IB2010/055756 dated Apr. 21, 2011.
International Search Report of the ISA for PCT/IB2010/055757 dated Apr. 21, 2011.
Office Action dated Mar. 24, 2015 for U.S. Appl. No. 13/515,086; 13 pages.
Notice of Allowance dated Nov. 12, 2015 for U.S. Appl. No. 13/515,086; 10 pages.
Request for Continued Examination (RCE) filed Feb. 3, 2016 for U.S. Appl. No. 13/515,086; 3 pages.
Notice of Allowance dated Feb. 25, 2016 for U.S. Appl. No. 13/515,086; 9 pages.
Australian Office Action Translation dated May 19, 2015 for Australian Application No. AU 2010/329476; 3 pages.
Levron, et al.; "On the Maximum Efficiency of Systems Containing Multiple Sources;" IEEE Transactions on Circuits and Systems; Regular Papers; vol. 57; No. 8; Aug. 2010; pp. 2232-2241; 10 pages.
Pregelj; "Impact of Distributed Generation on Power Network Operation;" Thesis—School of Electrical and Computer Engineering; Georgia Institute of Technology; Dec. 2003; 228 pages.
Yamadaya, et al.; "Control Method for Autonomous Changing the Number of DC-DC Converters to Improve Efficiency;" IEEE INTELEC 2009;Oct. 2009; 5 pages.
Decision of Rejection dated Jul. 7, 2015 for Japanese Patent Application No. 2012-542678; 5 pages.

* cited by examiner

SYSTEM FOR THE ELECTRONIC MANAGEMENT OF PHOTOVOLTAIC CELLS WITH ADAPTED THRESHOLDS

CROSS REFERENCE TO RELATED APPLICATIONS

This application is a National Stage application of PCT/IB2010/055756 filed on Dec. 10, 2010 and published in the French language, and entitled "SYSTEM FOR THE ELECTRONIC MANAGEMENT OF PHOTOVOLTAIC CELLS WITH ADAPTED THRESHOLDS" which claims priority to French application FR0958899 filed on Dec. 11, 2009.

DOMAIN OF THE INVENTION

The present invention relates to the domain of photovoltaic generators and more specifically photovoltaic modules integrating the electronic system; a module of this type includes a photovoltaic generator and a system for the electronic management of photovoltaic cells.

TECHNOLOGICAL BACKGROUND

In a manner known per se, a photovoltaic generator (PVG) includes one or more photovoltaic (PV) cells connected in series and/or in parallel. In the case of inorganic materials, a photovoltaic cell essentially comprises a (pn or pin junction) diode composed on the basis of a semiconductor material. This material has the property of absorbing light energy, a significant part of which can be transferred to charge carriers (electrons and holes). The constitution of a (pn or pin junction) diode by the doping of two zones of type N and type P respectively—possibly separated by a non-doped region (referred to as "intrinsic" and designated by "i" in the pin junction)—allows the charge carriers to be separated for them then to be collected via electrodes which the photovoltaic cell comprises. The maximum potential difference (open-circuit voltage, $V_{OC}$) and the maximum current (short-circuit current, $I_{CC}$) that the photovoltaic cell can supply are a function of both the materials making up the cell as a whole and the conditions surrounding this cell (including illumination via the spectral intensity, temperature, etc.). In the case of organic materials, the models are markedly different—making further reference to the notion of donor and acceptor materials in which electron-hole pairs known as excitons are created. The objective remains the same: to separate the charge carriers to collect and generate a current.

FIG. 1 shows schematically an example of a photovoltaic generator (according to the prior art). Most photovoltaic generators comprise at least one panel, itself comprising photovoltaic cells connected in series and/or in parallel. A plurality of groups of cells can be connected in series to increase the total voltage of the panel; a plurality of groups of cells can also be connected in parallel to increase the intensity delivered by the system. In the same way, a plurality of panels can be connected in series and/or in parallel to increase the voltage and/or the amperage of the generator according to the application.

FIG. 1 shows a photovoltaic generator comprising two parallel branches, each containing three groups of cell 2. In order to guarantee the electrical safety of the photovoltaic generator, non-return diodes 3 and bypass diodes 4 can be provided. The non-return diodes 3 are connected in series to each parallel branch of the generator in order to avoid the flow in the cells of a negative current arriving from the load or from other branches of the generator. The bypass diodes 4 are connected in anti-parallel to the groups 2 of cells. The bypass diodes 4 enable the separation of a group 2 of cells presenting a deficiency or a shadowing problem and solve the problem of hot spots.

The maximum voltage of the generator corresponds to the sum of the maximum voltages of the cells of which it is comprised, and the maximum current that the generator can deliver corresponds to the sum of the maximum currents of the cells. The maximum voltage $V_{OC}$ of a cell is reached for a cell on no load, i.e. for a zero delivered current (open circuit) and the maximum current $I_{CC}$ of a cell is reached when its terminals are short-circuited, i.e. for a zero voltage on the terminals of the cell. The maximum values $V_{OC}$ and $I_{CC}$ depend on the technology and the material used to implement the photovoltaic cell. The maximum value of the current $I_{CC}$ also depends strongly on the level of insolation of the cell. A photovoltaic cell thus presents a non-linear current/voltage characteristic ($I_{PV}$, $V_{PV}$) and a power characteristic with a maximum power point (MPP) which corresponds to optimum voltage values $V_{opt}$ and optimum current values $I_{opt}$. FIG. 2 shows the current/voltage ($I_{PV}$, $V_{PV}$) and power/voltage ($P_{PV}$, $V_{PV}$) characteristics of a photovoltaic cell with its maximum power point (identified by PPM in the figure). Similarly, a photovoltaic generator will present a non-linear current/voltage characteristic and a power characteristic with a maximum power point. If a part of the cells is shadowed, or if one or more cells of the group is defective, the maximum power point MPP of this group will be displaced.

It is known to optimize the operation of a photovoltaic generator through the use of a command to search for the maximum power, known as a Maximum Power Point Tracker (MPPT). An MPPT command of this type can be associated with one or more static converters (CS) which, according to the applications, can be a direct-current/alternating-current (DC/AC) converter or a direct-current/direct-current (DC/DC) converter. FIG. 1 thus shows a DC/AC static converter 8 connected to the output of the generator and collecting the electrical energy produced by all of the cells of the generator to deliver it to a load. According to the requirements of the load, the converter can be made to increase or reduce the output voltage and/or to invert the output voltage. FIG. 1 thus shows an MPPT command 6 associated with the converter 8.

The MPPT command 6 is designed to control the converter(s) 8 in order to obtain an input voltage which corresponds to the optimum voltage value $V_{opt}$ of the photovoltaic generator (PVG), corresponding to the maximum point of the power characteristic. The maximum power point depends on a plurality of parameters that are variable through time, notably the insolation present, the temperature or the ageing of the cells or the number of cells in a functional state.

In this way, the output of the photovoltaic generator is not too adversely affected by the malfunction or shadowing of certain cells. The electrical output of the generator depends directly on the state of each photovoltaic cell.

The power delivered by the photovoltaic generator will vary as a function of the insolation. Notably, not one but two or three or even more converters can be used as a function of the power. The method consists in adapting the number of (cell or phase) converters as a function of the changes in the power produced by the PVG. In fact, the use of a single converter is not necessarily advantageous in order to manage substantial power variations, the conversion output being adversely affected. The output of a power converter constituted on the basis of a single phase (or of a single converter) reduces when the PV power supply is maximum, whereas the structure including three converters has a tendency to maintain a virtually constant output regardless of the delivered PV power. This will result in a greater transfer of energy to the battery.

FIG. 3 shows an arrangement of this type, including at the output of the PV cells three CS (which, in this case, are BOOST converters). These converters are actuated as a function of the generator power in relation to the peak power of the device (Ppeak). In a known manner, when the power delivered by the PVG is less than or equal to one third of the Ppeak, one CS is used; when the power delivered by the PVG is between ⅓ and ⅔ of the Ppeak, 2 CS are used, and when the power delivered is greater than ⅔ of Ppeak, 3 CS are used.

There is therefore a need to increase the conversion output of a PVG.

SUMMARY OF THE INVENTION

The invention thus provides a system for the electronic management of a photovoltaic generator, the system including:
- a plurality of n static converters (11, 12, 13) connected in parallel, each converter (11, 12, 13) being electrically connected to at least one photovoltaic cell (10) of said generator,
- the number of converters connected being determined by comparing the power generated with thresholds P1, P2, . . . Pn-1, these thresholds being defined as the values of the powers substantially at the point of intersection of the efficiency curves for an increasing number of converters.

According to one embodiment, n is equal to 3.

According to one embodiment, the first threshold is less than ⅓, preferably between 20 and 33%, advantageously between 23 and 32%.

According to one embodiment, the second threshold is less than ⅔, preferably between 35 and 55%, advantageously between 40 and 50%.

According to one embodiment, the threshold values depend on the optimal voltage value $V_{opt}$ of said at least one photovoltaic cell.

According to one embodiment, the threshold values are dependent on the input voltage of the converters, advantageously the input voltage is the optimal voltage value $V_{opt}$ of said at least one photovoltaic cell.

According to one embodiment, the threshold values are dependent on the period of the year and/or on the sunshine.

According to one embodiment, the threshold values are dependent on the duty cycle of the converters.

According to one embodiment, the threshold values are dependent on the temperature of the converters.

According to one embodiment, the threshold values are dependent on the aging of the converters.

According to one embodiment, the threshold values are determined and stored in the memory of the management system, the threshold values applied being modifiable as a function of the measurement of a parameter of the photovoltaic generator.

According to one embodiment, the system comprises a device for determining the efficiency curve as a function of power.

According to one embodiment with rotation of the CS in the system, the converters are connected in turn.

According to one alternative of this embodiment with rotation of the CS, the rotation of the converters is effected in the event of variation in the number of converters employed.

According to one alternative of this embodiment with rotation of the CS, the rotation of the converters depends on the state of the components of the converters.

The subject-matter of the invention is also a photovoltaic generator including:
- at least one photovoltaic cell;
- the management system according to the invention.

The subject-matter of the invention is also a method for controlling a photovoltaic generator, including:
- at least one photovoltaic cell;
- a plurality of n static converters (11, 12, 13) connected in parallel, each converter (11, 12, 13) being electrically connected to at least one photovoltaic cell (10);

said method including the steps of:
- determination of the power generated by said at least one photovoltaic cell and comparison with the peak power;
- comparison with threshold values P1, P2, . . . Pn-1;
- these thresholds P1, P2, . . . Pn-1, being defined as the values of the powers substantially at the point of intersection of the efficiency curves for an increasing number of converters at least one photovoltaic cell;
- connection of i converters when the measured power value lies between Pi-1 and Pi or of all the converters if the measured power value is greater than Pn-1.

According to one embodiment with rotation of the CS, in the method according to the invention:
- the ith converter no longer being connected during the connection of the other converters when all the converters are not connected.

According to one alternative of this embodiment with rotation of the CS, the method includes the steps of:
- connection of at least one first converter;
- connection of a higher number of converters;
- then, in the event of the connection of a lower number of converters, said first converter is not connected.

According to one alternative of this embodiment with rotation of the CS, in the method, the step of rotation of the converters is carried out when the measured power value changes between the thresholds Pi-1 and Pi.

According to one alternative of this embodiment with rotation of the CS, the method includes the steps of:
- determination of the duration of use and/or of the number of use of each converter;
- connection of the converters such that the duration of use and/or the number of use is more or less equal for the converters over a given period.

The methods of the invention are particularly suitable for the generators according to the invention.

DETAILED DESCRIPTION OF EMBODIMENTS OF THE INVENTION

The invention proposes a system for the electronic management of a photovoltaic generator comprising a plurality of (cell or phase) converters which may be DC/AC or DC/DC, typically three converters, connected to photovoltaic cells. The converters are electrically connected to at least one photovoltaic cell in order to collect the energy produced by this cell and transfer it to a load. The term "load" refers to the electrical application for which the energy produced by the photovoltaic generator is intended. The description that follows is given with reference to 3 converters, but it is understood that the invention applies identically to a higher number. CS will be the acronym used below to designate a (in this case static) converter.

In a conventional manner, these converters are controlled by a command known as MPPT. For example, this maximum power point tracker command MPPT can implement an algorithm which identifies the influence of a voltage change on the power delivered by the generator and causes a shift in the voltage in the direction identified as increasing the power. Thus, an algorithm of this type consists in measuring the power delivered by the generator for a first voltage and, after a certain time, in imposing a second voltage higher than the first then measuring or estimating the corresponding power. In the case where the power corresponding to the second voltage is higher than the power corresponding to the first voltage, the next step of the algorithm is to impose a third, even higher voltage. In the opposite case, the third voltage applied is lower than the first voltage. Thus, by degrees, the system can continuously adapt the voltage on the terminals of the photovoltaic generator in order to approximate as closely as possible the maximum power point. It is understood that other algorithms can be implemented for the MPPT command.

Figure 1:
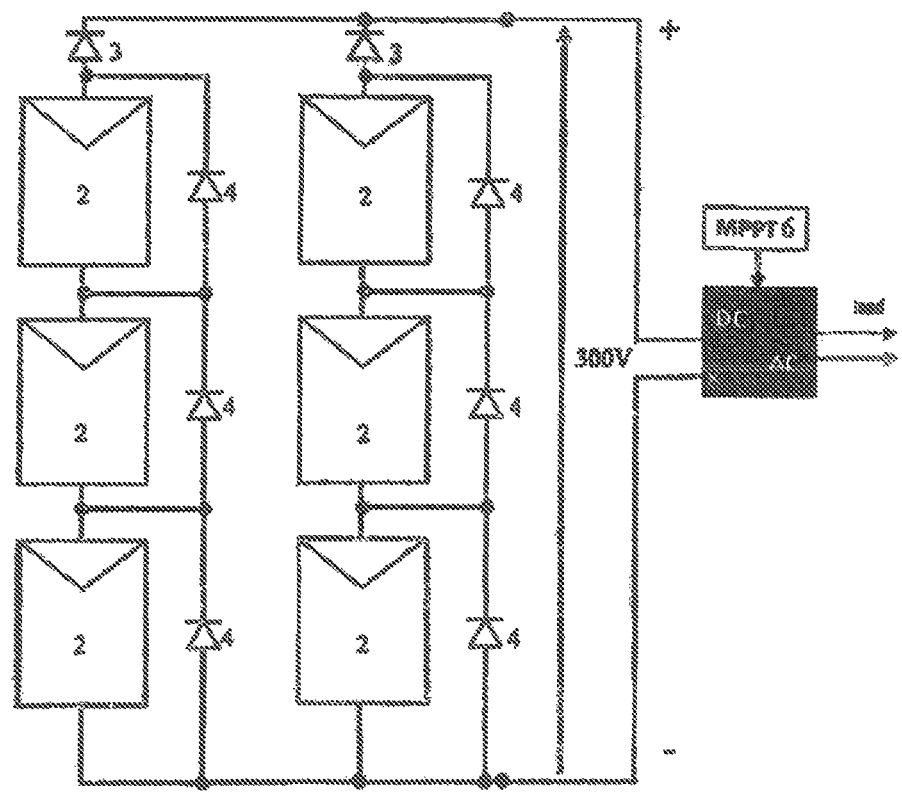
FIG. 1, already described, shows a diagram of a photovoltaic generator of the prior art.
Figure 2:
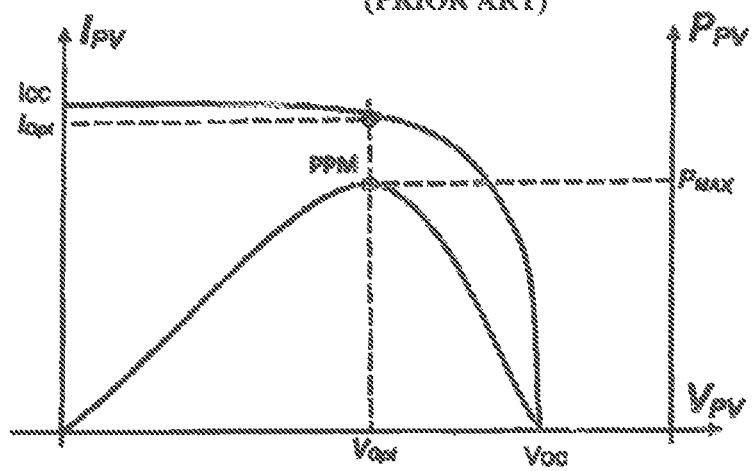
FIG. 2, already described, shows theoretical current/voltage and power characteristics of a photovoltaic cell.
Figure 3:
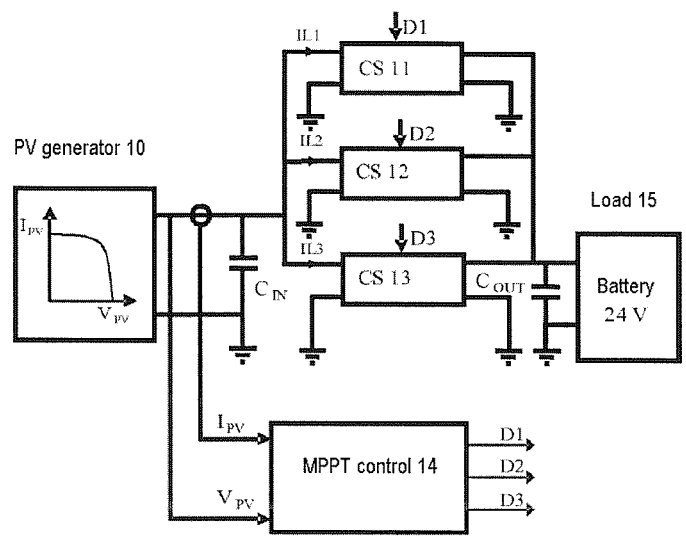
FIG. 3 shows a diagram of a PVG including a plurality of converters (here 3 static converters CS of BOOST type)

FIG. 3 shows a system of this type, and the PVG includes a photovoltaic unit 10, connected to CS 11, 12, 13 (BOOST 1, 2 and 3) and to an MPPT command 14, the output of the CS being connected to a battery 15.

The control of the converters incorporates the efficiency curves of the converters. Such a curve is given in FIG. 4. In this figure is represented the efficiency for a phase, for two phases and for three phases. Ppeak is given by way of example at 85 W. It is noted that for one phase, the efficiency increases up to the point of around ⅓ of Ppeak. For two phases, the efficiency increases up to a point with a value lying between around 35 W and 40 W. For three phases, the efficiency is greater from this point onwards.

The application of the prior art corresponds to two predetermined thresholds of change in the number of converter. As a function of the power measured by the MPPT management system, i.e. less than ⅓ Ppeak, between ⅓ and ⅔ Ppeak and more than ⅔ Ppeak, the management system then employs one, two or three converters.

Figure 4:
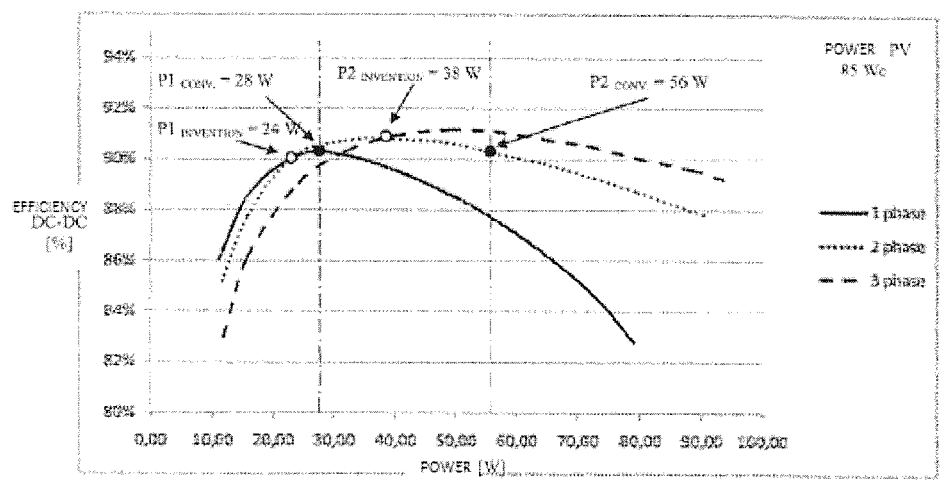
FIG. 4 shows the efficiency curves for 3 CSs.

The invention takes into account the true curve of the efficiency as a function of the number of converters. One then seeks to optimize the efficiency as a function of the number of converters, and the points of intersection of the power curves of the converters are determined as a function of their number. Thus, in FIG. 4, the first point of intersection between the efficiency curve for one converter and for two converters gives the first threshold P1, which threshold will then be stored in the memory of the management system. When the power delivered by the cells PV is below this threshold, a CS will be employed, whereas when the power is above this threshold P1, then 2 CSs will be employed. FIG. 4 also shows the point of intersection between the curve with two CSs and that with 3 CSs. It is noted that the threshold onwards of which the efficiency is higher is greatly shifted from the point at ⅔. This second point is the threshold P2, below which 2 CSs are employed and above which 3 CSs are employed as a function of the power delivered by the cells PV and their comparison with respect to Ppeak.

The prior art is based on a partitioning into thirds in the case of three converters, starting from the postulate that the efficiency will be optimal for an optimal number of converters. For three converters, the optimal number is 1, 2 or 3, and the span has been divided into 3. The invention breaks away from this postulate, by adopting threshold values as near reality as possible of the converted power. It is observed in FIG. 4 that the efficiency is maximal with the invention.

The values of P1 an P2 are, in the case represented, respectively 28% and 45%. In a general manner, the threshold P1 is below ⅓, and it is typically between 20 and 33%, advantageously between 23 and 32%. In general, the threshold P2 is below ⅔, and it is typically between 35 and 55%, advantageously between 40 and 50%. Of course, other values may be determined as a function of the devices used.

Figure 5:
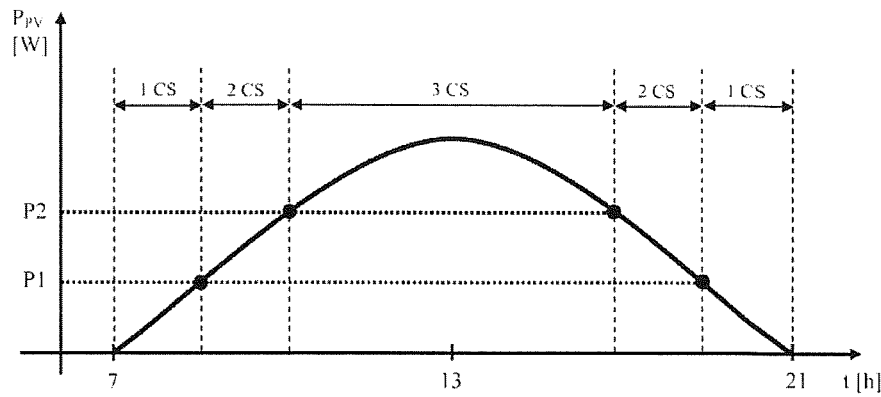
FIG. 5 shows the number of CSs as a function of the time of day with the invention.

Thus, as a function of the time of day, an appropriate number of CSs are used. FIG. 5 represents the number of CSs as a function of the time of day. The embodiment with 3 CSs is the preponderant one during the day, whereas it represented only a third according to the prior art.

The same principle is applicable to any number of converters, whether this be 2, 3, 4 or more, the number of converters connected (out of a total of n converters) being determined by comparing the power generated with thresholds P1, P2, . . . Pn-1, these thresholds being defined as the values of the powers at the point of intersection of the efficiency curves for an increasing number of converters, the threshold P1 being the intersection between the efficiency curves of 1 and 2 converters, the threshold Pn-1 being the intersection between the efficiency curves of n-1 and n converters.

The threshold values P1 and P2 vary as a function of the apparatuses used for the manufacture of the photovoltaic generators (PVGs). It is possible to measure the efficiency curves of the CSs as a function of the number of phases, namely to plot the curve for FIG. 4 and to store these values in the memory of the management system. These values will than be used by the system without modification.

It is also possible to take into account the factors which influence the efficiency curves.

It is in particular possible to take account of the season of the year and/or the characteristics of the electronic devices themselves.

The season of the year is a factor which may be taken into account, since the temperature of the panel PV varies as a function of the seasons. The characteristics of the panel also vary as a function of the seasons, in particular the optimal value of voltage $V_{opt}$ which varies as a function of the period of the year. By way of example, it is possible to have a variation of the optimal value of voltage $V_{opt}$ as follows (the value of the optimal voltage decreasing when the temperature of the panel increases):

| Winter | Spring | Summer | Autumn |
| --- | --- | --- | --- |
| 18 V | 16 V | 14.5 V | 17 V |

As a function of the optimal value of voltage $V_{opt}$, the threshold values will also vary. It will for example be possible to have the threshold values P1 and P2, expressed in % of Ppeak, as follows (the above values of 28% and 45% are presumed to be obtained in autumn, by way of example).

|  | Winter 18 V | Spring 16 V | Summer 14.5 V | Autumn 17 V |
|---|---|---|---|---|
| P1 (% Ppeak) | 24 | 29 | 32 | 28 |
| P2 (% Ppeak) | 41 | 47 | 47 | 45 |

It is therefore possible to adapt the values of the thresholds P1 and P2 as a function of the season, after having stored these values in the memory of the management system (and they are applied as a function of a calendar), or else to use the optimal values of voltage $V_{opt}$ measured by the system (the MPPT) to apply associated threshold values P1 and P2, the memory of the system comprising a correspondence between the various values of voltage and of thresholds.

The value of the optimal voltage $V_{opt}$ may also vary as a function of sunshine, with values which in general decrease as the level of insolation decreases.

Moreover, the efficiency of a converter varies as a function of the latter's characteristics. In particular, the efficiency of a converter may vary as a function of the duty cycle, of the temperature of the element and of its aging.

The efficiency of a power converter may be defined as the capacity of the latter to restore on its output port, the maximum of the power present on its input port, the difference with respect to 100% being the losses.

In the case of a DC/DC boost converter, conventionally used in PVGs, the losses correspond to the joule losses of the passive components and of the connection facility, as well as the conduction and switching losses of the active elements (field-effect transistor and diode).

These losses may vary principally as a function of three principle parameters which are the duty cycle, the temperature and the aging, their relative importance generally being in this order.

Thus, the efficiency of a converter is in general dependent on the duty cycle.

The duty cycle is defined (for a boost converter) as follows:

$$\alpha = 1 - V_{in}/V_{out}$$

The output voltage $V_{out}$, namely the voltage of the battery, may therefore influence the duty cycle, for example in the case of over or undercharge, or when replacing with a battery of a different nominal voltage.

The voltage $V_{in}$ may also affect the value of the duty cycle. In the photovoltaic applications with MPPT control, this voltage corresponds to the optimal voltage of the panel ($V_{opt}$), the voltage at which the power produced by the PVG is maximum, Now, it was seen above that this voltage may vary in particular as a function of the seasons (temperature of the panel) and of sunshine.

To take account of the duty cycle, the management system may undertake measurements of the voltages across the terminals of the converter and adapt the thresholds accordingly. Moreover, the value of the optimal voltage ($V_{opt}$) being already measured, the measurement of this value will be used when determining the duty cycle, which may therefore be determined at the same time as this optimal voltage value.

Thus, the efficiency of a converter is in general dependent on the temperature of the components, in particular of the field-effect transistor and of the diode. For the transistor, the resistance increases as the junction temperature grows, thus causing a rise in the conduction losses. For the diode, the effect is the reverse, the conduction losses decreasing as the temperature increases. However, the effects are very difficult to foresee, in particular since they stem from pooled use in a converter. In a general manner, the efficiency of a converter depends on the temperature, the efficiency varying with temperature variations.

To take account of the temperature, one or more thermal probes may be provided for measuring the temperature of the components and for injecting the result of the measurement into the management system.

Thus, the efficiency of a converter is in general dependent on its aging. The resistance of the transistor increases during aging, as does the value of the threshold voltage for the diode. The aging or prolonged operation has the effect of modifying the electrical behavior of the active components as well as an increase in the losses, resulting in modification of the behavior of the efficiency of the converter.

To take account of aging, a counter may be provided for measuring for example the number of cycles of the diode and determining an age of the electronic system.

It is also possible to determine "on site" the efficiency curves by incorporating a measurement rig into the management system for the PVG. In such a case, the system will undertake the measurement of the thresholds P1 and P2 according to a prerecorded routine, at predetermined times (on a given date and/or at a given time), at predetermined intervals, after a predetermined value of energy delivered, etc., or else randomly. It is otherwise possible to store in the memory of the management system the values of P1 and P2 corresponding to each situation encountered when implementing a PVG. It also possible to operate in a hybrid manner, namely part of the information is stored and another part of the information is measured. For example, the values of the seasons are stored whereas the temperature of the components is measured.

According to one advantageous embodiment, the system integrates a CS rotation routine to avoid imposing continuous stress on a single CS. In fact, in FIG. 3, the converter CS 11 is continuously connected, and therefore continuously receives the current to be converted. The other CS are used according to the changes taking place in the generation of the PV power. CS 11 is therefore continuously subjected to stress, and is furthermore subjected to changes in power to be processed in the event of variations in PV power. The reliability of the system is therefore reduced as one of the components is continuously subjected to stress. According to the advantageous embodiment, there is a rotation of the CS employed.

The rotation can be controlled in the event of changes in the PV power generated by the panels or can be controlled according to the state of the converters, or both. A random allocation command can also be used.

According to one embodiment, the change of CS takes place in the event of the increase in the number of CS employed. For example, if CS 11 is connected, and the command determines that 2 CS must be used, CS 12 and 13 will then be employed, whereas CS 11 will no longer be connected. If the number of CS returns to one unit, CS 12 (or CS 13) will then be connected rather than CS 11, which will still be idle. In the case where the 3 CS must be connected, the rotation takes place during the return to 1 or 2 CS. In this case, the starting point is a situation where CS 11 is connected, then the 3 CS are connected, then the return conditions require 2 CS so CS 12 and 13 are connected or, if the return conditions require only 1 CS, CS 12 or 13 will be connected.

According to a different embodiment, the change of CS takes place due to a calculation of the use of the CS. This calculation can be based on the duration of use, the rotation being carried out in such a way as to ensure a duration of use more or less equal for all the CS over a given period. This period may be one day, several days or a fraction of a day, for example one or more hours, wherein this duration may also be a function of the time of day and/or the season. Thus, according to this embodiment, the CS that must be employed is the one that has been least used, i.e. the one having the least usage time. The calculation can also be carried out by counting the number rather than the duration of use or stresses of the CS, independently of the duration of use. In this case, the CS that must be employed is therefore the one that has been stressed the least number of times. It is also possible to envisage an embodiment in which the two variants are combined.

According to a different embodiment, it is possible for the rotation to be carried out in a random manner, a random generator then being provided in the management system. In the event of the increase or reduction in the number of CS, the choice is made in a random manner, possibly in "shuffle" mode if necessary (this mode corresponds to a mode in which the CS that has been used is excluded from the random selection).

In the description above, the CS rotation is carried out when there is a change in the number of CS employed. It is of course possible to provide for this rotation to take place when the number of CS employed is constant (insofar as it is different from the maximum number). Thus, when the meteorological conditions are such that only one CS is employed, a routine can be provided that exchanges this CS with a CS initially idle, in such a way that one CS is not used continuously for more than a given duration.

The rotation of the converters employed has the effect of reducing the thermal and electrical stresses to which the active components are subjected in the event of power variations.

The thermal variations produce mechanical constraints in the semiconductors, due in large part to the difference in the level of the expansion coefficients of the materials which is used during manufacture, for example 4 ppm/° C. for silicon against 16 ppm/° C. for copper and 24 ppm/° C. for aluminum. The result of the mechanical constraints sustained by electrical contacts after numerous thermal cycles is the appearance of micro-cracks on the contacts, even to the point of the latter being broken. The object of the embodiment with CS rotation is to distribute the thermal and electrical stress over all of the converters.

The electronic management system according to the invention may also include safety functions, controlling the shutdown of the converters following a message indicating, for example, overheating of the components of the PVG. The electronic management system according to the invention may also include an anti-theft function. The management system according to the invention may furthermore transmit information relating to the operating condition of the groups of cells and/or the converters to a control centre of an electrical network. This facilitates the maintenance of the PVGs. In particular, the operator responsible for maintenance is thus alerted more quickly to a malfunction of certain groups of photovoltaic cells or certain converters and may consequently undertake measures.

The management system according to the invention may be totally or partially integrated into a photovoltaic generator.

According to one possible embodiment, multi-junction photovoltaic devices can be used. It then becomes necessary to manage the problem of electrical coupling of the different junctions. A multi-junction photovoltaic device, for example a tandem-junction device, refers to a photovoltaic device comprising a plurality of single junctions stacked in such a way as to increase the zone of solar spectrum absorption by the device. Tandem-junction photovoltaic devices allow a better electrical conversion output to be obtained. The main disadvantage of the electrical coupling in a tandem-junction photovoltaic device is the need for a harmonization in the performances of the photovoltaic cells that make up the tandem, regardless of the insolation conditions. This ideal case is not feasible in reality since the current production of each cell of the tandem is spontaneously different according to the region of the spectrum in which they are active, and varies as a function of the insolation conditions. This results in an intrinsic limitation of the tandem-junction photovoltaic device by the weakest of its elements. A current limitation of this type substantially reduces the theoretical output of a tandem-junction photovoltaic device. One solution consists in electrically decoupling the junctions of a tandem-junction photovoltaic device. The photovoltaic cells of the tandem are still optically coupled but are electrically decoupled. Each junction is then connected to two electrical electrodes; a four-electrode photovoltaic device is thus obtained (in the case of a tandem). By connecting the converters to each (at least one) photovoltaic cell of the tandem, the system allows a multi-junction photovoltaic device to be obtained that operates with electrically decoupled photovoltaic cells, each one managed in an optimum manner via the management system according to the invention.

The following examples illustrate the invention without limiting it.

EXAMPLE

In this example, a system comprising 3 CSs, implemented according to the prior art with thresholds fixed at ⅓ and ⅔ of PV/peak and a system comprising 3 CSs, implemented according to the invention, are compared.

The test protocol chosen to evaluate the energy gain achieved by the method according to the invention consisted in using the same input source (solar simulator) and the same multi-phase power card (behavior of identical electrical components). The simulator allowed the application in both cases of the same power profile (for example the production of a module with a peak power of 85 W over a relatively sunny day), whereas the MPP was obtained using the same MPPT command, or only the values of P1 and P2 have differed.

Figure 6:
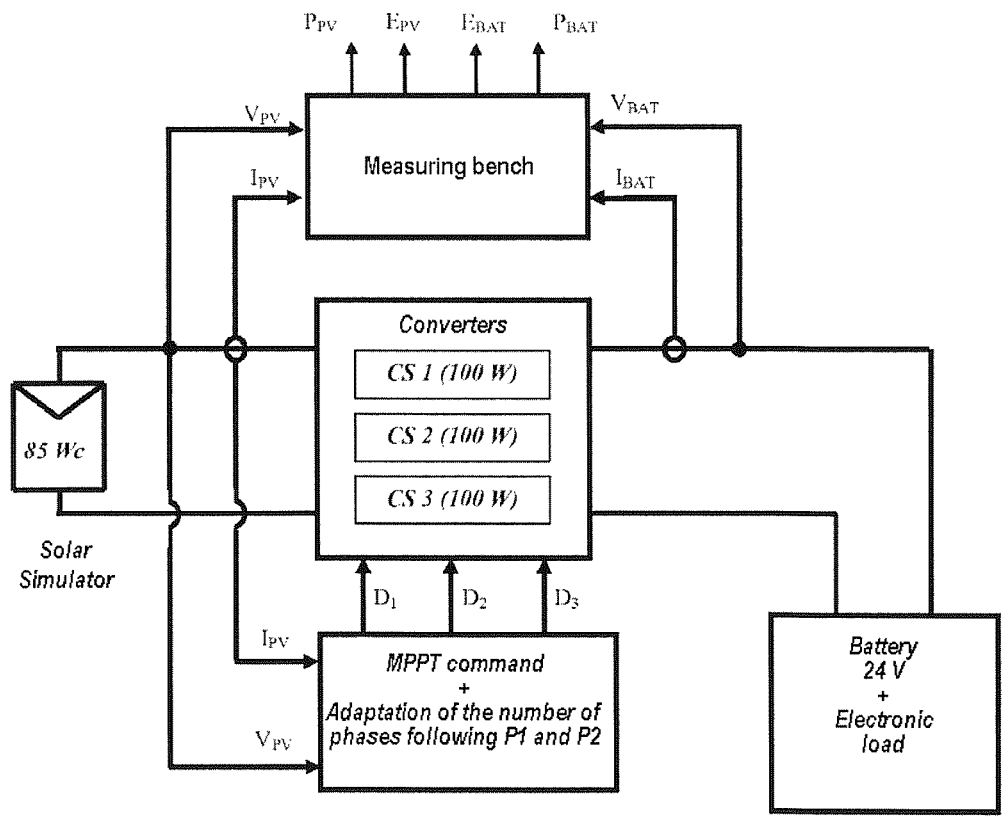
FIG. 6 shows the scheme used in the examples.

During this test, a 24 V battery was used to which an electronic load was connected in order to guarantee continuously the nominal voltage of the latter (24 V). FIG. 6 shows the measurement system used.

On the basis of the measuring bench, the current and the voltage present at the input and at the output of the converter are simultaneously measured. These values allow the PV power ($P_{PV}$) supplied by the simulator and the power transmitted to the battery ($P_{BAT}$) and therefore the output of the converter ($P_{BAT}/P_{PV}$) to be deduced. By taking into account the time variable (test duration in hours), the quantity of PV energy produced ($E_{PV}$) and transferred to the battery ($B_{BAT}$) is then calculated.

The determination of the thresholds P1 and P2 according to the method of the invention is represented in FIG. 4. The thresholds are respectively 28% and 45%.

The following results are obtained, the comparative corresponding to thresholds of ⅓ and ⅔, in accordance with the prior art:

|  | PV energy [Wh] | Battery energy [Wh] | dc-dc output [%] |
|---|---|---|---|
| Comparative | 387.4 | 344 | 88.8 |
| Invention | 387.6 | 346.6 | 89.5 |

During this test, the two systems received approximately the same amount of energy on their input port, i.e. 387 Wh. The system in which the thresholds were determined by the method according to the invention made it possible to transfer 2.4 Wh more to the load, this ultimately resulting in a gain at the level of the conversion efficiency of the power stage of 0.7%.

The invention claimed is:

1. An electronic control system of a photovoltaic generator having a plurality of photovoltaic cells, the electronic control system comprising:
a plurality of converters coupled in parallel, each of said plurality of converters being electrically selectively coupled to at least one photovoltaic cell of the photovoltaic generator, wherein a number of said plurality of converters coupled to the photovoltaic cells is determined by comparing a variable power generated by the photovoltaic cells to power threshold values (P1, P2, . . . Pn-1) and wherein the threshold values are defined as power values substantially at a point of intersection of at least two of a plurality of efficiency curves, wherein each of said plurality of efficiency curves corresponds to an efficiency curve for a predetermined increasing number of converters such that a threshold value P1 is the intersection between an efficiency curve of one converter and an efficiency curve of two converters, and a threshold value Pn-1 is an intersection between the efficiency curves of n-1 and n converters, wherein a particular one of the threshold values P1, P2, . . . Pn-1 used to determine the number of said plurality of converters coupled to the photovoltaic cells is selected based upon an amount of power generated at an output of the photovoltaic generator, and wherein the threshold values are selected based upon a temperature of said plurality of converters.

2. The system according to claim 1, wherein said plurality of converters is three converters.

3. The system according to claim 2, wherein a first threshold is less than ⅓ of a peak power, preferably between 20% and 33%, advantageously between 23% and 32%.

4. The system according to claim 3, wherein a second threshold is less than ⅔ of a peak power, preferably between 35% and 55%, advantageously between 40% and 50%.

5. The system according to claim 1 wherein the threshold values depend upon an optimal voltage value $V_{opt}$ of said at least one photovoltaic cell.

6. The system according to claim 1 wherein the threshold values are a function of an input voltage provided to said plurality of converters and wherein the input voltage is an optimal voltage value $V_{opt}$ of said at least one photovoltaic cell.

7. The system according to claim 1 wherein the threshold values are selected based upon a period of the year and/or sunlight.

8. The system according to claim 1 wherein the threshold values are selected based upon a duty cycle of the plurality of converters.

9. The system according to claim 1 wherein the threshold values are selected based upon an age of the plurality of converters.

10. The system according to claim 1 further comprising a memory management system and wherein the threshold values are stored in said memory management system and wherein the threshold values are subject to change depending upon a measurement of a parameter of the photovoltaic generator.

11. The system according to claim 1 further comprising a device for determining the efficiency curve in function of a power.

12. The system according to claim 1 wherein said plurality of converters are connected in turn.

13. The system according to claim 12 wherein a rotation of said plurality of converters is a variation in the number of converters engaged.

14. The system according to claim 12 wherein a rotation of said plurality of converters depends upon a state of components of said plurality of converters.

15. The system according to claim 1 wherein the electronic control system has threshold values stored therein and wherein the threshold values are subject to change depending upon a measurement of a parameter of the photovoltaic generator.

16. A method of controlling a photovoltaic generator having at least one photovoltaic cell and a plurality of n parallel coupled converters, each of the plurality of n parallel coupled converters being electrically coupled to at least one of the at least one photovoltaic cells, the method comprising:
determining a variable power generated by the at least one photovoltaic cell;
comparing the power generated by the at least one photovoltaic cell with peak power;
comparing the power generated by the at least one photovoltaic cell with one or more power threshold values, wherein the thresholds values are defined as power values substantially at a point of intersection of two or more efficiency curves of a plurality of efficiency curves, wherein each of said plurality of efficiency curves corresponds to an efficiency curve for a predetermined number of converters and such that a threshold value P1 is the intersection between an efficiency curve of one converter and an efficiency curve of two converters, and a threshold value Pn-1 is an intersection between the efficiency curves of n-1 and n converters, wherein a particular one of the threshold values P1, P2, . . . Pn-1 used to determine the number of said plurality of converters coupled to the at least one photovoltaic cell is selected based upon an amount of power generated at an output of the photovoltaic generator, and wherein the threshold values are selected based upon a temperature of said plurality of converters; and
coupling i converters when a measured power value is between Pi and Pi-1 or all the converters if the measured power value is greater than Pn-1.

17. The method of claim 16 further comprising, in response to a measured power value, connecting additional converters when all converters of the plurality of n parallel coupled converters are not connected.

18. The method of claim 17, comprising:
- a step of connecting at least a first one of the plurality of n parallel coupled converters to at least one photovoltaic cell; and
- a following step of connecting a larger number of the plurality of n parallel coupled converters to at least one photovoltaic cell; and
- in response to a need to reduce the number of the plurality of n parallel coupled converters to at least one of the at least one photovoltaic cells, disconnecting the first one of the plurality of n parallel coupled converters.

19. The method of claim 18 further comprising rotating the plurality of n parallel coupled converters in response to a change in measured power value in thresholds between Pi and Pi-1.

20. The method of claim 19 further comprising:
- determining one or more of: a duration of use and/or a number of use of each of the plurality of n parallel coupled converters;
- connecting each of the plurality of n parallel coupled converters such that over time, one or more of duration of use and/or the number of use is substantially equal amongst the plurality of n parallel coupled converters.

21. The method of claim 20 for controlling a photovoltaic generator comprising at least one photovoltaic cell and a management system having threshold values stored therein and wherein the threshold values are subject to change depending upon a measurement of a parameter.

* * * * *